United States Patent
Shallal et al.

(10) Patent No.: US 12,353,283 B2
(45) Date of Patent: *Jul. 8, 2025

(54) SERIAL PRESENCE DETECT RELIABILITY

(71) Applicant: Rambus Inc., San Jose, CA (US)

(72) Inventors: Aws Shallal, Cary, NC (US); Chen Chen, Cupertino, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/629,677

(22) Filed: Apr. 8, 2024

(65) Prior Publication Data
US 2024/0345922 A1  Oct. 17, 2024

Related U.S. Application Data

(63) Continuation of application No. 17/857,241, filed on Jul. 5, 2022, now Pat. No. 11,977,442.

(60) Provisional application No. 63/270,969, filed on Oct. 22, 2021, provisional application No. 63/222,291, filed on Jul. 15, 2021.

(51) Int. Cl.
 G06F 11/10 (2006.01)
 G06F 11/07 (2006.01)
 G06F 11/16 (2006.01)

(52) U.S. Cl.
 CPC ........ G06F 11/1068 (2013.01); G06F 11/076 (2013.01); G06F 11/1658 (2013.01)

(58) Field of Classification Search
 CPC . G06F 11/1068; G06F 11/1658; G06F 11/076
 See application file for complete search history.

(56) References Cited

U.S. PATENT DOCUMENTS

| | | | |
|---|---|---|---|
| 5,606,315 A | 2/1997 | Gaskins | |
| 6,298,426 B1 | 10/2001 | Ajanovic | |
| 6,711,676 B1 | 3/2004 | Zomaya et al. | |
| 7,007,130 B1 | 2/2006 | Holman | |
| 7,219,237 B1 | 5/2007 | Trimberger | |
| 2001/0000822 A1* | 5/2001 | Dell | G11C 5/06 711/170 |
| 2005/0138267 A1* | 6/2005 | Bains | G11C 7/20 711/100 |
| 2008/0046997 A1 | 2/2008 | Wang | |

(Continued)

FOREIGN PATENT DOCUMENTS

DE  102012207562 A1  12/2012

*Primary Examiner* — Samir W Rizk
(74) *Attorney, Agent, or Firm* — The Neudeck Law Firm, LLC

(57) ABSTRACT

A serial presence detect (SPD) device includes nonvolatile memory to store SPD information. Parity information suitable for single error correct and double error detect (SECDED) is also stored in association with the SPD information in the nonvolatile memory. The combination of SPD information and parity information is organized into codewords addressable at each memory location. During an initialization period occurring after a power on reset and before the SPD device is accepting I2C commands, the SPD device checks each memory location (codeword) for errors. Each error detected is counted to provide an indicator of device health. Before the initialization period expires, the SPD device writes a corrected codeword back to the nonvolatile memory.

20 Claims, 7 Drawing Sheets

(56) References Cited

U.S. PATENT DOCUMENTS

2011/0016374 A1* 1/2011 Grivna ............... G06F 11/1016
  714/E11.032
2022/0076776 A1   3/2022 Helmick et al.
2022/0350705 A1* 11/2022 Montero ............ G06F 11/1417

* cited by examiner

STORE CODEWORDS HAVING DATA INFORMATION AND ERROR CORRECTING INFORMATION IN A PLURALITY OF NONVOLATILE MEMORY LOCATIONS
602

DETERMINE WHETHER EACH OF THE CODEWORDS HAS AN ERROR
604

DETECT A FIRST ERROR IN A FIRST CODEWORD READ FROM A FIRST NONVOLATILE MEMORY LOCATION
606

IN RESPONSE TO DETECTING THE FIRST ERROR, ADVANCE AN ERROR COUNT
608

CORRECT THE FIRST ERROR IN THE FIRST CODEWORD TO GENERATE A CORRECTED FIRST CODEWORD
610

DETECT A SECOND ERROR IN A SECOND CODEWORD READ FROM A SECOND NONVOLATILE MEMORY LOCATION
612

IN RESPONSE TO DETECTING THE SECOND ERROR, ADVANCE THE ERROR COUNT
614

STORE THE CORRECTED FIRST CODEWORD TO THE FIRST NONVOLATILE MEMORY LOCATION
616

*FIG. 6*

SERIAL PRESENCE DETECT RELIABILITY

BRIEF DESCRIPTION OF THE DRAWINGS

FIG. 6 is a flowchart illustrating a method of generating reliability information.

DETAILED DESCRIPTION OF THE EMBODIMENTS

In an embodiment, a serial presence detect (SPD) device includes nonvolatile memory to store SPD information. Parity information suitable for single error correct and double error detect (SEC-DED) is also stored in association with the SPD information in the nonvolatile memory. The combination of SPD information and parity information is organized into codewords addressable at each memory location. During an initialization period occurring after a power on reset and before the SPD device is accepting I2C commands, the SPD device checks each memory location (codeword) for errors. Each error detected is counted to provide an indicator of device health. Before the initialization period expires, the SPD device writes a corrected codeword back to the nonvolatile memory.

Figure 1:
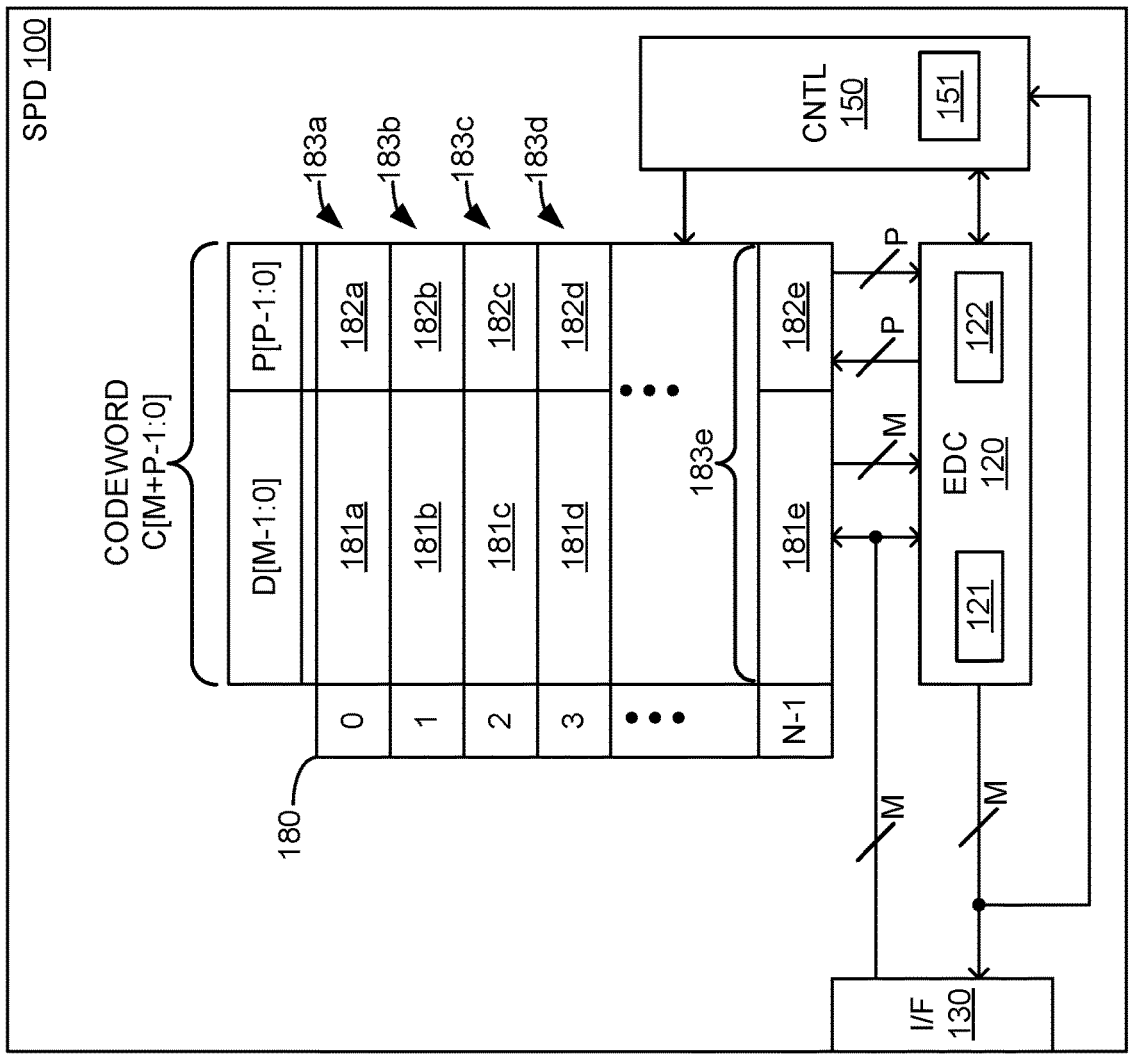
FIG. 1 is a block diagram illustrating a serial presence detect device.

FIG. 1 is a block diagram illustrating a serial presence detect device. In FIG. 1, SPD device 100 comprises nonvolatile memory error detect and correct EDC circuitry 120, interface 130, control circuitry 150, and nonvolatile memory 180. EDC circuitry 120 includes error count register 121 and corrected codeword register 122. Control circuitry 150 includes scan and repair control 151.

Interface 130 is operatively coupled to nonvolatile memory 180, EDC circuitry 120, and control circuitry 150. EDC circuitry 120 is operatively coupled to interface 130, nonvolatile memory 180, and control circuitry 150. Control is operatively coupled to interface 130, EDC circuitry 120, and nonvolatile memory 180.

Interface 130 receives commands, addresses, and data from a host (not shown in FIG. 1). Control circuitry 150 receives at least the commands and addresses received via interface 130. Control circuitry 150, in response to commands and addresses received by SPD device 100, controls EDC circuitry 120, nonvolatile memory 180, and interface 130. Control circuitry 150 controls EDC circuitry 120, nonvolatile memory 180, and interface 130 to read and write data 181a-181e and parity information 182a-182e to nonvolatile memory 180. In an embodiment, data 181a-181e comprises information stored in nonvolatile memory according to a serial presence detect standard (e.g., a DDR5 SPD standard promulgated by JEDEC). I In response to write commands/accesses received via interface 130, control circuitry 150 controls EDC circuitry 120 to generate P bits of parity information 182a-182e based respectively on the M bits of data 181a-181e, received via interface 130, to be written to nonvolatile memory 180. EDC circuitry 120 provides the generated parity information 182a-182e to nonvolatile memory 180 to be stored in association with the corresponding data 181a-181e (e.g., at the same memory location and/or accessed by the same address 0 to N), respectively. Control circuitry 150 controls nonvolatile memory 180 to write the data 181a-181e and parity information 182a-182e to a specified address/memory location (received via interface 130) in nonvolatile memory 180. Each association (e.g., data 181a to parity information 182a) in nonvolatile memory 180 forms an M+P bit codeword 183a-183e (C[M+P−1:0]). Thus, a write access that stores a data 181a-181e and parity information 182a-182e may be referred to as a store or a write of a respective codeword 183a-183e. In an embodiment, data 181a-181e and parity information 182a-182e form codewords 183a-183e that implement error correction and detection scheme capable of correcting single bit errors and detecting double bit errors (SEC-DED).

In response to read commands/accesses received via interface 130, control circuitry 150 controls nonvolatile memory 180 to read the data 181a-181e and parity information 182a-182e (i.e., a codeword 183a-183e) from a specified address/memory location (received via interface 130) in nonvolatile memory 180. The read data 181a-181e and the corresponding parity information 182a-182e, respectively (i.e., a codeword 183a-183e), is provided from nonvolatile memory 180 to EDC circuitry 120. Control circuitry 150 controls EDC circuitry 120 to check both the data 181a-181e and corresponding parity information 182a-182e.

If there is not an error in the data 181a-181e and corresponding parity information 182a-182e, the read data 181a-181e is provided to interface 130 for communication with a host (not shown in FIG. 1). If there is an error in either the data 181a-181e or corresponding parity information 182a-182e, the read data 181a-181e is corrected before being provided to interface 130 for communication with a host (not shown in FIG. 1). In addition, if there is an error in either the data 181a-181e or corresponding parity information 182a-182e, EDC circuitry 120 is controlled to correct the error and subsequently control circuitry 150 controls EDC circuitry 120 and nonvolatile memory 180 to write the corrected data 181a-181e and/or corrected parity information 182a-182e (i.e., codeword 183a-183e) back to the specified address/memory location the erroneous codeword 183a-183e was read from.

In an embodiment, prior to corrected data 181a-181e being communicated to interface 130 and/or prior to the corrected codeword 183a-183e being written to nonvolatile memory, the corrected codeword 183a-183e may be stored in corrected codeword register 122. In an embodiment, each error detected may cause the advancing (e.g., incrementing a value) of a counter value stored by error count register 121. In response to a specified command or read of a specified address (e.g., mode register), control circuitry 150 may provide the value of error count register 121 to interface 130 for communication with a host (not shown in FIG. 1). Error count register 121 may be reset to an initial value (e.g., zero) during a reset operation and/or power-on reset condition/operation.

In an embodiment, SPD device 100 (and control circuitry 150, in particular) is reset and/or is powered on. This condition results in a period of time where the supply voltage to SPD device 100 is adequate for the operation of the internal circuitry of SPD device 100, but SPD device 100 is not ready to accept commands via interface 130. This period of time may be known as an initialization period and may be abbreviated, or specified in a standard, as $t_{INIT}$. In an embodiment, $t_{INIT}$ equals 10 ms.

In an embodiment, SPD device 100 (and scan and repair control 151 of control circuitry 150, in particular) iteratively reads all (or substantially all—greater that 90%) of the codewords 183a-183e stored in nonvolatile memory 180 during the initialization period. Each read codeword 183a-183e is provided to EDC circuitry 120 and checked for an error. For each codeword 183a-183e determined to have an error, the count in error count register 121 is advanced.

In an embodiment, the first codeword 183a-183e determined to have an error is corrected and stored in corrected codeword register 122. However, selecting other codewords 183a-183e to be corrected (e.g., last found to have and error) is contemplated.

Once SPD device 100 has checked all (or substantially all) of the codewords 183a-183e in the memory locations of nonvolatile memory 180, and while still during the initialization period, the corrected codeword 183a-183e in corrected codeword register 122 is written back to the memory location the erroneous codeword 183a-183e was read from. In an example, the initialization period is approximately 10 ms. SPD device 100 takes 5 ms to read and check all of the codewords 183a-183e in nonvolatile memory 180, and 2 ms to write the corrected codeword 183a-183e back to nonvolatile memory 180. Thus, it should be understood that, in this example, all of the codeword 183a-183e entries in nonvolatile memory 180 may be read and checked for errors, and at least one corrected codeword 183a-183e may be written back to nonvolatile memory before the initialization period expires and SPD device 100 must respond to commands received via interface 130.

Figure 2:
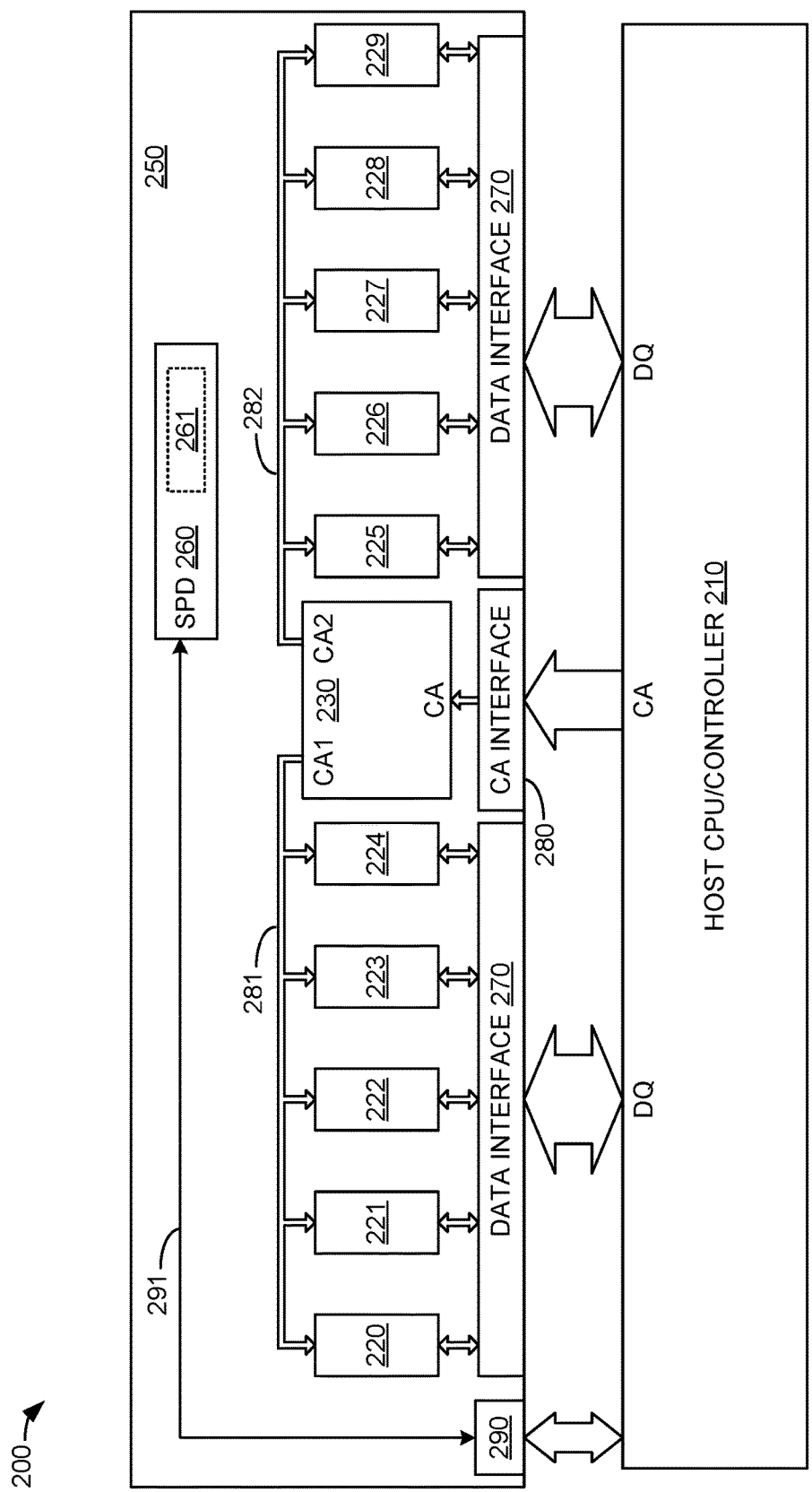
FIG. 2 is a block diagram illustrating an example memory module also draw 5 memory each side.)

FIG. 2 is a block diagram illustrating an example memory module. In FIG. 2, system 200 comprises host CPU/controller (host) 210 and module 250. Host 210 is operatively coupled to module 250 via data signals (DQ), command-address signals (CA), and serial presence detect signals. Module 250 includes memory components 220-229, buffer device 230, serial presence detect (SPD) device 260, data interface 270, command-address interface 280, and SPD interface 290. Memory components 220-229 may be dynamic random access memory devices (DRAM). Command-address interface 280 is operatively coupled to buffer device 230. Buffer device 230 is operatively coupled to memory components 220-224 via secondary command-address signals CA1 281 (also referred to as CA bus 281). Buffer device 230 is operatively coupled to memory components 225-229 via secondary command-address signals CA2 282 (also referred to as CA bus 282).

SPD interface 290 is operatively coupled to SPD device 260 via SPD signals 291. SPD device 260 includes EDC circuitry 261. SPD interface 290 and SPD signals 291 may implement or conform to a serial channel communication protocol or specification. For example, SPD interface 290 and SPD signals 291 may be, or comprise, one or more signals that conform to a serial presence detect (SPD) bus, I2C bus, and/or I3C bus. SPD device 260 may be, or comprise, SPD device 100 as discussed herein with respect to FIG. 1.

Buffer device 230 may also be referred to as a command/address (CA) Register. Thus, module 250 may be considered to be a registered module, or Registered Dual Inline Memory Module (R-DIMM). This, however, is merely one example of the types of module that may include SPD device 260. Other examples of modules include dual inline memory module (DIMM) such as DDR4, DDR5 etc. DIMM, load reduced DIMM (LRDIMM), registered DIMM (RDIMM), fully buffered DIMM (FB-DIMM), or unbuffered DIMM (UDIMM).

In an embodiment, host 210, memory components 220-229, buffer device 230, and SPD device 260 are integrated circuit type devices, such as are commonly referred to as "chips". The controller functionality of a memory controller (such as the controller functionality of host 210) manages the flow of data going to and from memory devices and/or memory modules. Memory components 220-229 may be standalone devices, or may include multiple memory integrated circuit dies—such as components of a multi-chip module. A memory controller can be a separate, standalone chip, or integrated into another chip. For example, a memory controller may be included on a single die with a microprocessor, or included as part of a more complex integrated circuit system such as a block of a system on a chip (SOC).

Buffer device 230 is operatively coupled to CA interface 280 and memory components 220-229 to help isolate the electrical loading of the on-module DRAM memory components 220-229 from the command-address channel coupled to host 210. Without buffer device 230, the aggregate load of memory components 220-229 would degrade the achievable signaling rate of the command-address channel and hence the overall bandwidth performance of the memory subsystem. In an embodiment, all command-address traffic sent between host 210 and memory components 220-229 is first received by buffer device 230 via CA interface 280.

In FIG. 2, a single CA interface 280 and two sets of secondary CA signals 281-282 are illustrated. It should be understood however, that in some embodiments, buffer device 230 may receive independent CA signals over two respective independent CA interfaces. These sets of independent CA signals may be received, for example, on opposite sides of module 250. In another example, these sets of independent CA signals may be time or otherwise multiplexed with each other on the same set of signal traces. Buffer device 230 may receive each of the two sets of independent CA signals and drive each of the two sets of CA signals, respectively, to two secondary CA signal sets (i.e., two channels from a host to 4 CA channels, where each DRAM channel includes a set of 4 or 5 DRAMs—two DRAM channels on the right and two DRAM channels on the left.)

In response to read commands/accesses received via SPD interface 290, SPD device 260 reads data and parity information 1 from a specified address/memory location in a nonvolatile memory. The read data and the corresponding parity data (i.e., a codeword), is provided from the nonvolatile memory to EDC circuitry. Using the read data and the read parity data, the EDC circuitry to checks the codeword for error(s).

If there is not an error in the read codeword, the read data is provided to SPD interface 290 for communication with host 210. If there is an error in the read codeword, the read data is corrected before being provided to SPD interface 290 for communication with host 210. In addition, if there is an error in the read codeword, SPD device 260 corrects the error and subsequently writes the corrected codeword back to the specified address/memory location in the nonvolatile memory the erroneous codeword was read from.

In an embodiment, each error detected by SPD device 260 may cause the advancing (e.g., incrementing a value) of a counter value stored by error count register. In response to a specified command or read of a specified address (e.g., mode register), SPD device 260 may provide the value of error count register to SPD interface 290 for communication with host 210. The error count register may be reset to an initial value (e.g., zero) during a reset operation and/or power-on reset condition/operation.

In an embodiment, module 250 (and SPD device 260, in particular) is reset and/or is powered on. This condition results in an initialization period of time where the supply voltage to SPD device 260 is adequate for the operation of the internal circuitry of SPD device 260, but SPD device 260 is not ready to accept commands via SPD signals 291.

In an embodiment, SPD device 260 iteratively reads all (or substantially all—greater that 90%) of the codewords stored in its nonvolatile memory during the initialization period. Each read codeword is provided to EDC circuitry and checked for errors. For each codeword determine to have an error, a count in an error count register is advanced.

In an embodiment, the first codeword determined to have an error is corrected and stored in a corrected codeword register. Once SPD device 260 has checked all (or substantially all) of the codewords in the memory locations of its nonvolatile memory, and while still during the initialization period, the corrected codeword in the corrected codeword register is written back to the memory location the erroneous codeword was read from. Thus, it should be understood that, all of the codeword entries in SPD device 260 may be read and checked for errors, and at least one corrected codeword may be written back to nonvolatile memory before the initialization period expires and SPD device 260 must respond to commands received via SPD signals 291.

Figure 3:
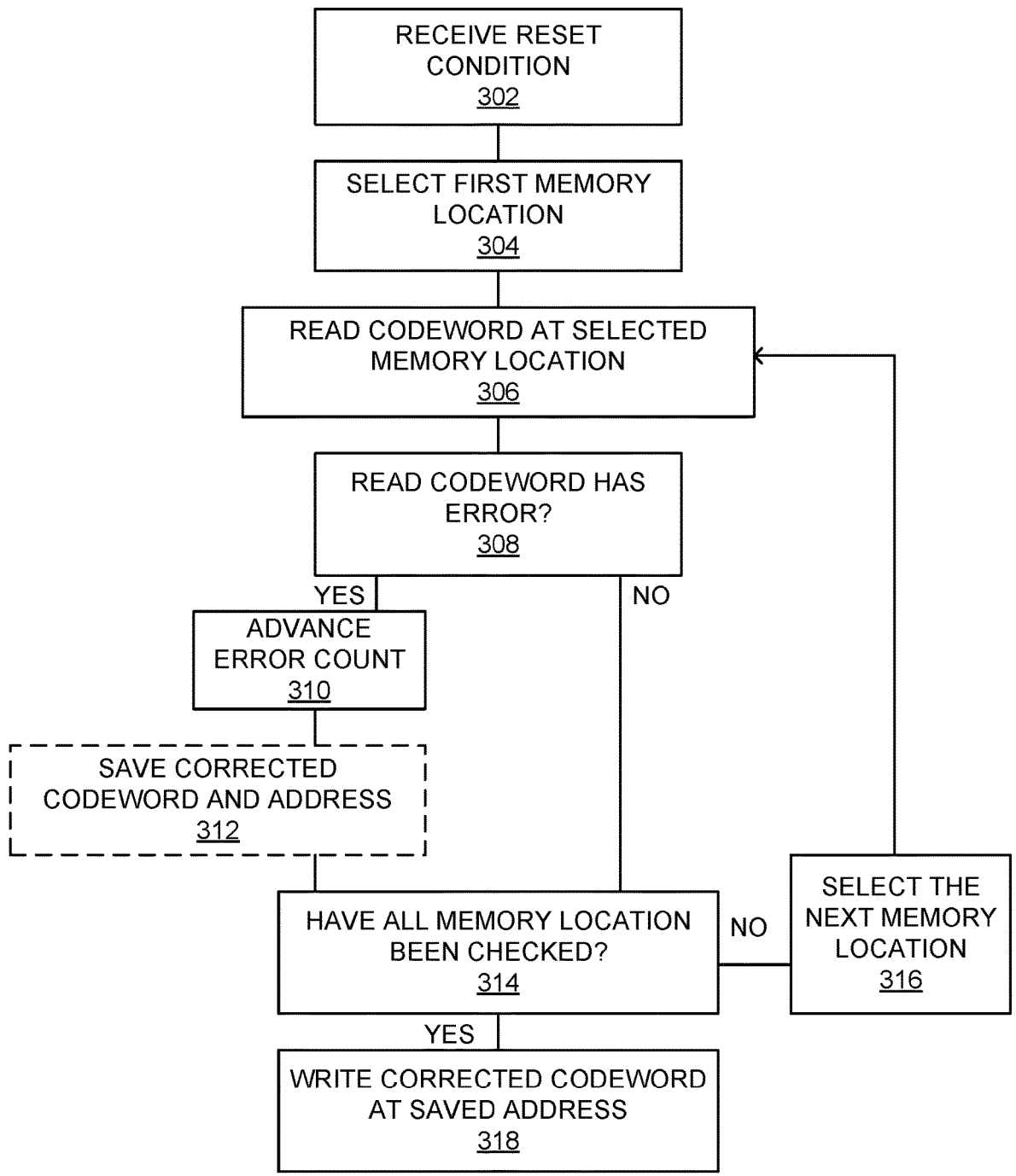
FIG. 3 is a flowchart illustrating a method to correct a nonvolatile memory error.

FIG. 3 is a flowchart illustrating a method to correct a nonvolatile memory error. One or more steps illustrated in FIG. 3 may be performed by, for example, SPD device 100, system 200, and/or their components. The steps illustrated in FIG. 3 may comprise A reset condition is received (302). For example, the power supply to SPD device 100 may ramp up from a low voltage to a voltage sufficient for the operation of SPD device 100.

A first memory location is selected (304). For example, control circuitry 150 may reset an address counter in scan and repair control 151 to an initial value (e.g., zero). The codeword at the selected memory location is read (306). For example, scan and repair control 151 may read a codeword 183a-183e from the location in nonvolatile memory 180 addressed by the address counter.

If the codeword that was read has an error, flow proceeds to box 310. If the codeword that was read does not have an error, flow proceeds to box 314 (308). In box 314, an error count is advanced (310). For example, if EDC circuitry 120 determines that the codeword (e.g., codeword 183c at address #2) read from nonvolatile memory has an error, scan and repair control 151 may advance the value in error count register 121. A corrected codeword and addressed are saved (312). Flow proceeds from box 312 to box 314. For example, if EDC circuitry 120 determines that the codeword read from nonvolatile memory (e.g., codeword 183c) has an error, scan and repair control 151 may correct the error in the codeword and save the corrected codeword in corrected codeword register 122.

If all of the memory locations have been checked, flow proceeds to box 314. If not all of the memory locations have been checked, flow proceeds to box 316 (314). In box 316, the next memory location is selected (316). For example, scan and repair control 151 may advance (e.g., increment) the address counter in scan and repair control 151 to the next memory location in nonvolatile memory 180. Flow proceeds from box 316 to box 306 with the next memory location selected.

In box 318, the corrected codeword is written at the saved address (318). For example, scan and repair control 151 may write the value in the corrected codeword register to the memory location in nonvolatile memory 180 to the location where it was originally read from when it had an error (e.g., writing a corrected codeword 183c to address #2).

Figure 4:
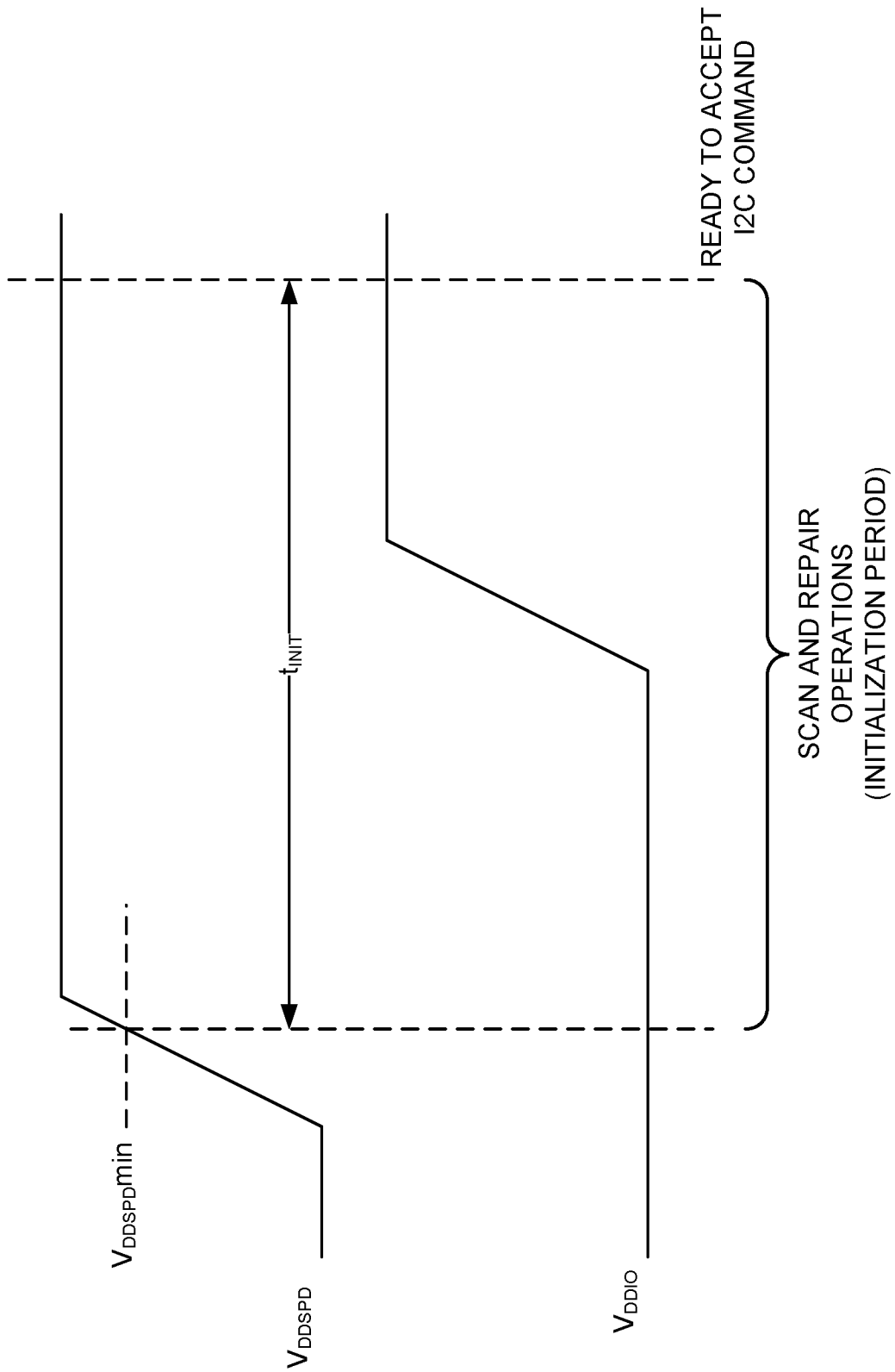
FIG. 4 is a diagram illustrating an example timing for detecting and correcting a nonvolatile memory error.

FIG. 4 is a diagram illustrating an example timing for detecting and correcting a nonvolatile memory error. The timing illustrated in FIG. 4 may be used by, for example, SPD device 100, system 200, and/or their components. The method illustrated in FIG. 3 may be performed and completed during, for example, the period labeled "Scan and repair operations (initialization period)" in FIG. 4.

In FIG. 4, the power supply voltage ($V_{DDSPD}$) to an SPD device and the input/output (IO) power supply voltage ($V_{DDIO}$) to the SPD device are illustrated versus time. At the starting time of FIG. 4, both $V_{DDSPD}$ and $V_{DDIO}$ are a low (or zero) volts. As time progresses left to right, $V_{DDSPD}$ ramps up until it meets then exceeds the minimum required voltage ($V_{DDSPD}$min) for the SPD device to operate. This crossing point is the start of the initialization period which lasts $t_{INIT}$. During the initialization period, $V_{DDIO}$ ramps up and then stabilizes at a predetermined voltage during the initialization period. At the end of the $t_{INIT}$ in duration initialization period, the SPD device should be ready to accept commands via an I2C interface (e.g., interface 130). In an embodiment, the SPD device has completed checking its nonvolatile memory for errors and optionally written one corrected codeword that was read with errors back to its nonvolatile memory during this initialization period (e.g., the process illustrated in FIG. 3).

Figure 5:
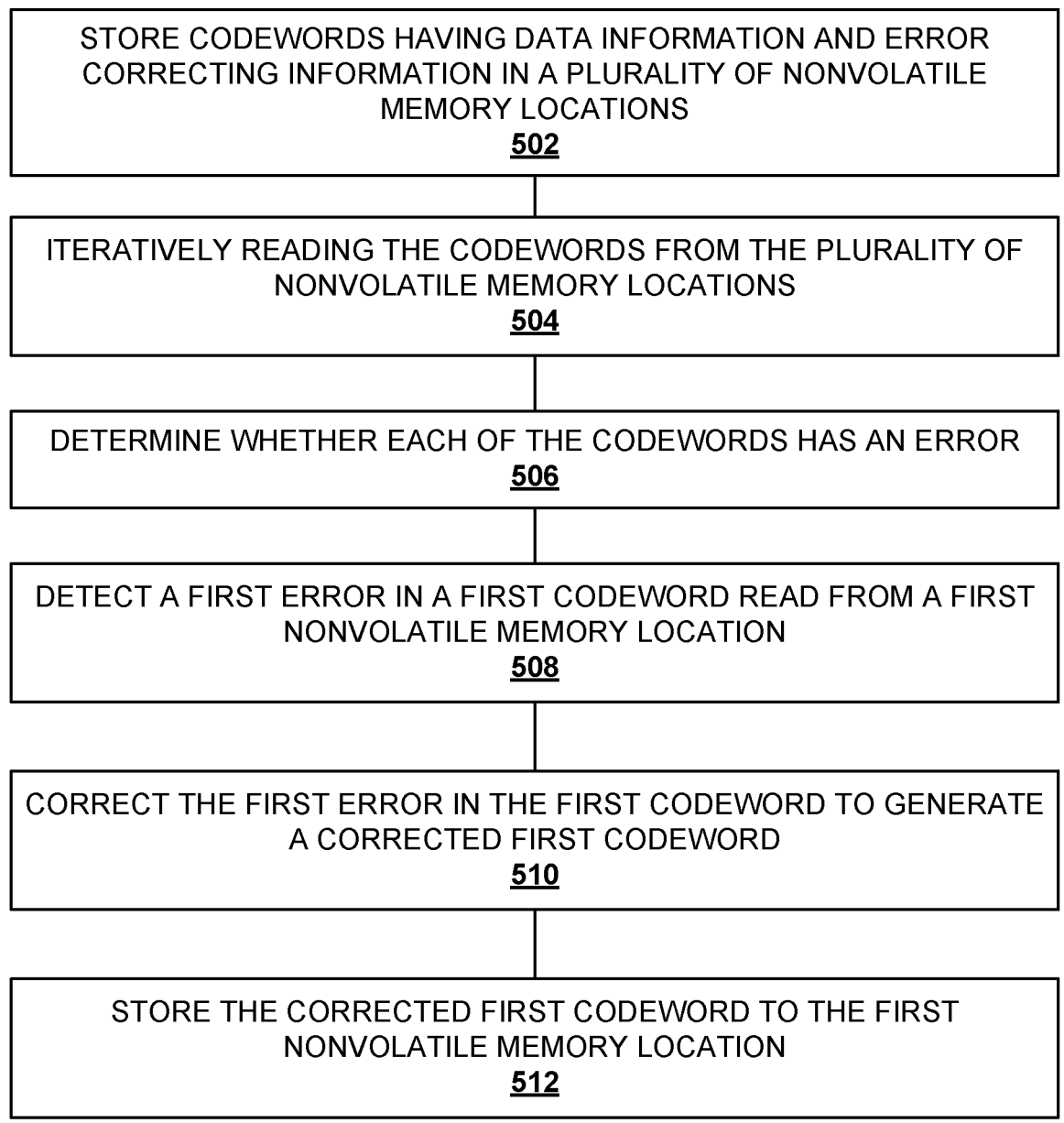
FIG. 5 is a flowchart illustrating a method of detecting and correcting a nonvolatile memory error.

FIG. 5 is a flowchart illustrating a method of detecting and correcting a nonvolatile memory error. One or more steps illustrated in FIG. 5 may be performed by, for example, SPD device 100, system 200, and/or their components. Codewords having data information and error correcting information are stored in a plurality of nonvolatile memory locations (502). For example, codewords 183a-183e having data 181a-181e and parity information 182a-182e, respectively, may be stored in N number (N>2) of memory locations in nonvolatile memory 180.

The codewords are iteratively read from the plurality of nonvolatile memory locations (504). For example, during an initialization period, scan and repair control 151 of control circuitry 150 may iteratively read all (or substantially all—greater that 90%) of the codewords 183a-183e stored in nonvolatile memory 180 and provide those codewords to EDC circuitry 120. Whether each of the codewords has an error is determined (506). For example, EDC circuitry 120 may determine whether each codeword 183a-183e received from nonvolatile memory 180 does or does not have an error.

A first error in a first codeword read from a first nonvolatile memory location is detected (508). For example, EDC circuitry 120 may detect an error in codeword 183c read from memory location #2. The first error in the first codeword is corrected to generate a corrected first codeword (510). For example, EDC circuitry 120 may correct the error EDC circuitry 120 detected in codeword 183c to generate a corrected codeword 183c. The corrected first codeword is stored to the first nonvolatile memory location (512). For example, the corrected codeword 183c may be written to memory location #2.

FIG. 6 is a flowchart illustrating a method of generating reliability information. One or more steps illustrated in FIG. 6 may be performed by, for example, SPD device 100, system 200, and/or their components. Codewords having data information and error correcting information are stored in a plurality of nonvolatile memory locations (602). For example, codewords 183*a*-183*e* having data 181*a*-181*e* and parity information 182*a*-182*e*, respectively, may be stored in N number (N>2) of memory locations in nonvolatile memory 180.

Whether each of the codewords has an error is determined (604). For example, during an initialization period, scan and repair control 151 of control circuitry 150 may iteratively read all (or substantially all—greater that 90%) of the codewords 183*a*-183*e* stored in nonvolatile memory 180 and provide those codewords to EDC circuitry 120. EDC circuitry 120 may determine whether each codeword 183*a*-183*e* received from nonvolatile memory 180 does or does not have an error. A first error in a first codeword read from a first nonvolatile memory location is detected (606). For example, EDC circuitry 120 may detect an error in codeword 183*b* read from memory location #1.

In response to detecting the first error, an error count is advanced (608). For example, in response to detecting the error in codeword 183*b*, SPD device 100 may advance (e.g., increment) the value in error count register 121. The first error in the first codeword is corrected to generate a corrected first codeword (610). For example, EDC circuitry 120 may correct the error EDC circuitry 120 detected in codeword 183*b* to generate a corrected codeword 183*b*.

A second error in a second codeword read from a second nonvolatile memory location is detected (612). For example, EDC circuitry 120 may detect an error in codeword 183*d* read from memory location #3. In response to detecting the second error, the error count is advanced (614). For example, in response to detecting the error in codeword 183*d*, SPD device 100 may advance (e.g., increment) the value in error count register 121. The corrected first codeword is stored to the first nonvolatile memory location (616). For example, the corrected codeword 183*b* may be written to memory location #1.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of SPD device 100, system 200, and/or their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 7:
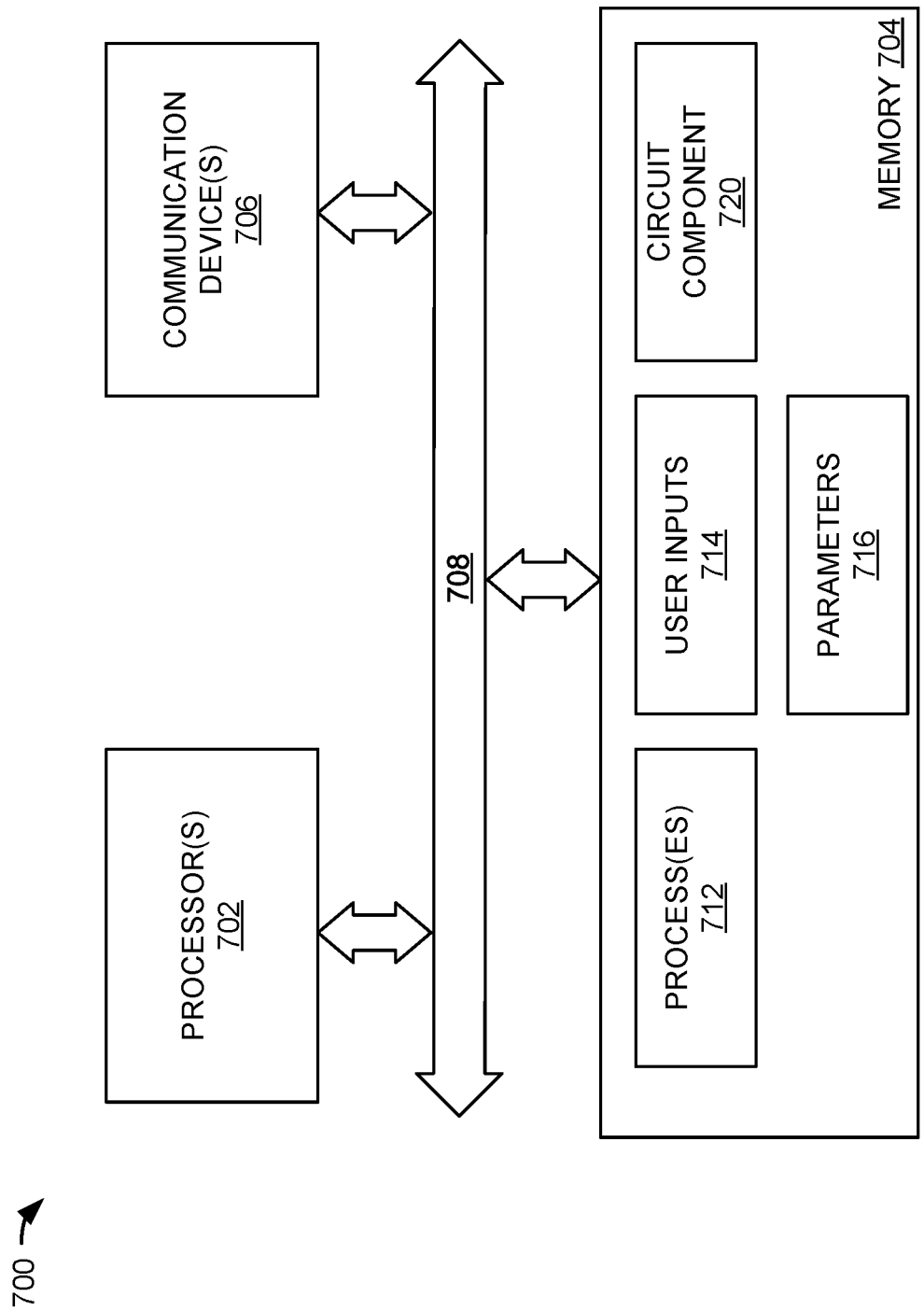
FIG. 7 is a block diagram of a processing system.

FIG. 7 is a block diagram illustrating one embodiment of a processing system 700 for including, processing, or generating, a representation of a circuit component 720. Processing system 700 includes one or more processors 702, a memory 704, and one or more communications devices 706. Processors 702, memory 704, and communications devices 706 communicate using any suitable type, number, and/or configuration of wired and/or wireless connections 708.

Processors 702 execute instructions of one or more processes 712 stored in a memory 704 to process and/or generate circuit component 720 responsive to user inputs 714 and parameters 716. Processes 712 may be any suitable electronic design automation (EDA) tool or portion thereof used to design, simulate, analyze, and/or verify electronic circuitry and/or generate photomasks for electronic circuitry. Representation 720 includes data that describes all or portions of SPD device 100, system 200, and their components as shown in the Figures.

Representation 720 may include one or more of behavioral, register transfer, logic component, transistor, and layout geometry-level descriptions. Moreover, representation 720 may be stored on storage media or communicated by carrier waves.

Data formats in which representation 720 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 714 may comprise input parameters from a keyboard, mouse, voice recognition interface, microphone and speakers, graphical display, touch screen, or other type of user interface device. This user interface may be distributed among multiple interface devices. Parameters 716 may include specifications and/or characteristics that are input to help define representation 720. For example, parameters 716 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 704 includes any suitable type, number, and/or configuration of non-transitory computer-readable storage media that stores processes 712, user inputs 714, parameters 716, and circuit component 720.

Communications devices 706 include any suitable type, number, and/or configuration of wired and/or wireless devices that transmit information from processing system 700 to another processing or storage system (not shown) and/or receive information from another processing or storage system (not shown). For example, communications devices 706 may transmit circuit component 720 to another system. Communications devices 706 may receive processes 712, user inputs 714, parameters 716, and/or circuit component 720 and cause processes 712, user inputs 714, parameters 716, and/or circuit component 720 to be stored in memory 704.

Implementations discussed herein include, but are not limited to, the following examples:

Example 1: A serial presence detect memory device, comprising: first nonvolatile memory circuitry to store serial presence detect data; second nonvolatile memory circuitry to store error detect and correct (EDC) data computed from the serial presence detect data; and scanning circuitry to read contents of the first nonvolatile memory circuitry and the second nonvolatile memory circuitry and to, in response to detecting an error in a first entry in either the first nonvolatile memory circuitry and the second nonvolatile memory circuitry, correct the first entry and write a corrected first entry to the first nonvolatile memory circuitry and the second nonvolatile memory circuitry.

Example 2: The serial presence detect memory device of example 1, wherein the scanning circuitry reads substantially all of the first nonvolatile memory circuitry and the second nonvolatile memory circuitry.

Example 3: The serial presence detect memory device of example 1, wherein the scanning circuitry reads substantially all of the first nonvolatile memory circuitry and the second nonvolatile memory circuitry during an initialization period.

Example 4: The serial presence detect memory device of example 3, wherein the first entry is a one of a plurality of entries with errors.

Example 5: The serial presence detect memory device of example 4, further comprising: counting circuitry to count a number of errors detected.

Example 6: The serial presence detect memory device of example 5, wherein the counting circuitry counts the number of errors detected during the initialization period.

Example 7: The serial presence detect memory device of example 5, wherein the counting circuitry counts the number of errors detected after the initialization period.

Example 8: The serial presence detect memory device of example 5, wherein the counting circuitry counts the number of errors detected both during and after the initialization period.

Example 9: A memory module, comprising: a plurality of volatile memory devices; a nonvolatile memory device comprising: a first plurality of nonvolatile memory cells organized into memory locations that each access a plurality of data bits; a second plurality of nonvolatile memory cells organized into corresponding memory locations that each access a plurality of error detection and correction information bits, the plurality of data bits at each memory location and the plurality of error detection and correction information bits at each corresponding memory location forming codewords accessed at each memory location; and error detection circuitry to access the codewords at each memory location and to detect and correct an error in a first codeword to form a corrected first codeword and to write the corrected first codeword to a first memory location where the first codeword was read from.

Example 10: The memory module of example 9, wherein error detection circuitry is to access the codewords at each memory location during an initialization period.

Example 11: The memory module of example 10, wherein the first codeword is a one of a plurality of codewords stored by the nonvolatile memory device having errors.

Example 12: The memory module of example 11, wherein the nonvolatile memory device further comprises: counting circuitry to count a number of errors detected.

Example 13: The memory module of example 12, wherein the counting circuitry counts the number of errors detected during the initialization period.

Example 14: The memory module of example 13, wherein the counting circuitry counts the number of errors detected after the initialization period.

Example 15: The memory module of example 12, wherein the counting circuitry counts the number of errors detected both during and after the initialization period.

Example 16: A method, comprising: storing codewords having data information and error correcting information in a plurality of nonvolatile memory locations; iteratively reading the codewords from the plurality of nonvolatile memory locations; determining whether each of the codewords has an error; detecting a first error in a first codeword read from a first nonvolatile memory location; correcting the first error in the first codeword to generate a corrected first codeword; and storing the corrected first codeword to the first nonvolatile memory location.

Example 17: The method of example 16, wherein the plurality of nonvolatile memory locations comprise substantially all of the nonvolatile memory locations accessible in a serial presence detect memory device.

Example 18: The method of example 16, further comprising: in response to detecting the first error in the first codeword, advancing an error count.

Example 19: The method of example 18, further comprising: detecting a second error in a second codeword read from a second nonvolatile memory location; and in response to detecting the second error in the second codeword, advancing an error count.

Example 20: The method of example 17, wherein iteratively reading the codewords from the plurality of nonvolatile memory locations and storing the corrected first codeword to the first nonvolatile memory location both occur during an initialization period.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A serial presence detect memory device, comprising:
a first plurality of nonvolatile memory cells organized into memory locations that each access a plurality of data bits;
a second plurality of nonvolatile memory cells organized into corresponding memory locations that each access a plurality of error detection and correction information bits, the plurality of data bits at each memory location and the plurality of error detection and correction information bits at each corresponding memory location forming codewords accessed at each memory location; and
error detection circuitry to access the codewords at each memory location and to detect and correct an error in a first codeword to form a corrected first codeword and to write the corrected first codeword to a first memory location where the first codeword was read from.

2. The serial presence detect memory device of claim 1, wherein the error detection circuitry is to access the codewords at each memory location during an initialization period.

3. The serial presence detect memory device of claim 1, wherein the first codeword is a one of a plurality of codewords stored by the serial presence detect memory device having errors.

4. The serial presence detect memory device of claim 1, further comprising:
   counting circuitry to count a number of errors detected.

5. The serial presence detect memory device of claim 4, wherein the counting circuitry counts the number of errors detected during an initialization period.

6. The serial presence detect memory device of claim 4, wherein the counting circuitry counts the number of errors detected after an initialization period.

7. The serial presence detect memory device of claim 4, wherein the counting circuitry counts the number of errors detected during an initialization period and after the initialization period.

8. A memory module, comprising:
   a plurality of volatile memory devices;
   a nonvolatile memory device comprising:
      first nonvolatile memory circuitry to store serial presence detect data;
      second nonvolatile memory circuitry to store error detect and correct (EDC) data computed from the serial presence detect data; and
      scanning circuitry to read contents of the first nonvolatile memory circuitry and the second nonvolatile memory circuitry and to, in response to detecting an error in a first entry stored by the nonvolatile memory device in either the first nonvolatile memory circuitry and the second nonvolatile memory circuitry, correct the first entry and write a corrected first entry to the first nonvolatile memory circuitry and the second nonvolatile memory circuitry.

9. The memory module of claim 8, wherein the scanning circuitry of the nonvolatile memory device reads all the first nonvolatile memory circuitry and the second nonvolatile memory circuitry.

10. The memory module of claim 8, wherein the scanning circuitry of the nonvolatile memory device reads all the first nonvolatile memory circuitry and the second nonvolatile memory circuitry during an initialization period.

11. The memory module of claim 8, wherein the first entry stored by the nonvolatile memory device is a one of a plurality of entries stored by the nonvolatile memory device with errors.

12. The memory module of claim 8, wherein the nonvolatile memory device further comprises:
   counting circuitry to count a number of errors detected.

13. The memory module of claim 12, wherein the counting circuitry of the nonvolatile memory device counts the number of errors detected during an initialization period.

14. The memory module of claim 12, wherein the counting circuitry of the nonvolatile memory device counts the number of errors detected after an initialization period.

15. A method, comprising:
   storing codewords having data information and error correcting information in a plurality of nonvolatile memory locations;
   determining whether each of the codewords has an error;
   detecting a first error in a first codeword read from a first nonvolatile memory location;
   based on detecting the first error, advancing an error count;
   correcting the first error in the first codeword to generate a corrected first codeword; and
   storing the corrected first codeword to the first nonvolatile memory location.

16. The method of claim 15, further comprising:
   detecting a second error in a second codeword read from a second nonvolatile memory location.

17. The method of claim 16, further comprising:
   based on detecting the second error in the second codeword, advancing the error count.

18. The method of claim 16, further comprising:
   based on detecting the second error in the second codeword, correcting the second error in the second codeword to generate a corrected second codeword; and
   based on detecting the second error in the second codeword, storing the corrected second codeword to the second nonvolatile memory location.

19. The method of claim 15, further comprising:
   iteratively reading the codewords from the plurality of nonvolatile memory locations.

20. The method of claim 19, wherein iteratively reading the codewords from the plurality of nonvolatile memory locations and advancing the error count occur during an initialization period.

* * * * *